(12) United States Patent
Lim

(10) Patent No.: US 9,297,858 B2
(45) Date of Patent: Mar. 29, 2016

(54) SECONDARY BATTERY MANAGEMENT SYSTEM AND METHOD FOR EXCHANGING BATTERY CELL INFORMATION

(75) Inventor: Jae Hwan Lim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 139 days.

(21) Appl. No.: 14/123,360

(22) PCT Filed: May 31, 2012

(86) PCT No.: PCT/KR2012/004309
§ 371 (c)(1),
(2), (4) Date: Dec. 2, 2013

(87) PCT Pub. No.: WO2012/165879
PCT Pub. Date: Dec. 6, 2012

(65) Prior Publication Data
US 2014/0117939 A1 May 1, 2014

(30) Foreign Application Priority Data
Jun. 3, 2011 (KR) .................. 10-2011-0053651

(51) Int. Cl.
H02J 7/00 (2006.01)
G01R 31/36 (2006.01)
(Continued)

(52) U.S. Cl.
CPC ......... *G01R 31/3606* (2013.01); *H01M 10/482* (2013.01); *H01M 10/486* (2013.01); *H02J 7/0004* (2013.01); *H02J 7/0014* (2013.01); *H02J 7/0022* (2013.01); *H02J 7/0086* (2013.01);
(Continued)

(58) Field of Classification Search
CPC .............. H02J 7/0031; H02J 2007/004; H02J 2007/0037; Y02E 60/12; H01M 10/48
USPC ......................................................... 320/134
See application file for complete search history.

(56) References Cited

U.S. PATENT DOCUMENTS 7,615,967 B2 11/2009 Cho et al.
8,217,620 B2 7/2012 Hanssen et al.
(Continued)

FOREIGN PATENT DOCUMENTS

CN 101162844 A 4/2008
CN 101184994 A 5/2008
(Continued)

OTHER PUBLICATIONS

International Search Report for corresponding International Application No. PCT/KR12/004309.
(Continued)

*Primary Examiner* — Arun Williams
(74) *Attorney, Agent, or Firm* — Hauptman Ham, LLP

(57) ABSTRACT

Provided is a secondary battery management system and method for exchanging information in a multi-pack parallel structure using the same, and more particularly, to a secondary battery management system and method for exchanging information in a multi-pack parallel structure using the same, including:
a unit battery cell;
a battery module in which a plurality of unit battery cells are disposed; and a voltage temperature management system (VTMS) generates a state information and generates a diagnosis information of battery module or the unit battery cells using unit battery cell information for the unit battery cells.

5 Claims, 4 Drawing Sheets

(51) Int. Cl.
H01M 10/48 (2006.01)
*H01M 10/44* (2006.01)
*G01R 19/165* (2006.01)

(52) U.S. Cl.
CPC ......... H02J7/0091 (2013.01); *G01R 19/16542* (2013.01); *G01R 31/362* (2013.01); *G01R 31/3658* (2013.01); *G01R 31/3682* (2013.01); *H01M 10/443* (2013.01); *H02J 2007/0098* (2013.01)

(56) References Cited

U.S. PATENT DOCUMENTS

| | | | |
|---|---|---|---|
| 2002/0003417 A1* | 1/2002 | Bito et al. | 320/152 |
| 2005/0242667 A1 | 11/2005 | Emori et al. | |
| 2007/0001679 A1 | 1/2007 | Cho et al. | |
| 2008/0086247 A1 | 4/2008 | Gu et al. | |
| 2008/0211459 A1 | 9/2008 | Choi | |
| 2008/0252257 A1 | 10/2008 | Hanssen et al. | |
| 2010/0106351 A1* | 4/2010 | Hanssen et al. | 701/22 |
| 2011/0050204 A1 | 3/2011 | Park | |

FOREIGN PATENT DOCUMENTS

| | | |
|---|---|---|
| EP | 1 798 100 | 6/2007 |
| EP | 1 914 861 | 4/2008 |
| EP | 2 043 222 | 4/2009 |
| JP | 2001-231178 | 8/2001 |
| JP | 2003-243044 | 8/2003 |
| JP | 2003-272718 | 9/2003 |
| JP | 2004-040993 | 2/2004 |
| JP | 2008-099538 | 4/2008 |
| JP | 2009-183025 | 8/2009 |
| JP | 2010-164329 | 7/2010 |
| KR | 10-2008-0032454 | 4/2008 |
| WO | 2009 036444 | 3/2009 |
| WO | 2010-134625 | 11/2010 |

OTHER PUBLICATIONS

Notification of European Search Report dated Nov. 11, 2014 for corresponding EP Patent Application No. 12 792 487.6.
Notification of Office Action dated Dec. 9, 2014 for corresponding JP Patent Application No. 2014-511307.

* cited by examiner

SECONDARY BATTERY MANAGEMENT SYSTEM AND METHOD FOR EXCHANGING BATTERY CELL INFORMATION

TECHNICAL FIELD

The present invention relates to a secondary battery management system and method for exchanging information in a multi-pack parallel structure using the same, and more particularly, to a secondary battery sub system enabling an increase in the number of battery cells and an increase in energy capacity by including a battery module configured of a plurality of battery cells coupled with each other in series and a voltage temperature management system (VTMS) connected to the battery module to measure voltage, temperature, and the like, for each battery cell and a secondary battery management system and method for exchanging information in a multi-pack parallel structure using the same.

BACKGROUND ART

Recently, a pressure on an increase in energy capacity is intensified so as to increase a fuel ratio of an electric vehicle (generally, including a hybrid car, a plug-in hybrid car, an electric car, and the like). However, an increase in capacity of unit battery cells is limited due to a limitation of capacity of a battery pack in terms of a process technology and a cell technology. For this reason, the energy of the battery pack is increased by arranging a predetermined unit battery cells in a serial and parallel structure.

In addition, in order to minimize tolerance current in a vehicle such as an electric bus, and the like, a high-voltage (about 700 V) motor is being developed. Therefore, the number of unit battery cells connected with each other in series has been very increased (for example, connecting 180 serial cells with each other in about 100 cells connected with each other in series). The pack parallel structure for increasing the number of serial unit battery cells and the energy capacity has a great effect on a technology of a battery management system (BMS) that transmits battery information to a vehicle controller within the electric vehicle. In particular, the increase in the number of unit battery cells causes problems such as an increase in weight and volume of wiring harness for sensing voltage, a reinforce of BMS internal voltage due to the formation of high voltage end, and the like.

In particular, since a battery status information calculation such as a state of charge (SOC) of a battery using the cell voltage value of the existing about 100 cells is calculated by receiving information of 180 cells, an error in a calculation may frequently occur.

The reason is that in the battery pack in which a plurality of serial unit battery cells are connected with each other in series, the wiring harness of voltage and temperature is connected to one sub BMS and each of the sub BMSs measures a current value flowing in each of the corresponding sub packs.

Further, the measured voltage, temperature, and current are used to calculate the state of charge (SOC), the tolerance current, or power of the battery, battery cooling, cell balancing, battery diagnosis information are calculated by a control unit of the sub BMS.

Further, each sub BMS transfers the calculated information and characteristic values among the measured values to a main BMS and the main BMS calculates and transfers the information to be transmitted to the vehicle controller using the corresponding sub BMS value as the information.

The voltage sensing number between the sub-pack and the sub BMS calculates each battery information in the sub BMS based on more than 100 voltage sensing wires, more than 10 temperature sensing wires, and data collected by each current sensing once.

Therefore, as the number of serial unit battery cells is increased, the wiring harness of the cell voltage and the battery temperature is long and thick and as a result, has a very vulnerable structure to the operation of the vehicle. Therefore, it is highly likely to cause malfunction and firing of a system during driving.

Further, the sub BMS is attached to the sub pack one by one and therefore, costs are greatly increased. In particular, for cell voltage of 100 cells or more, high-voltage elements need to be used and therefore, costs are greatly increased.

DISCLOSURE

Technical Problem

An object of the present invention is to provide a secondary battery unit sub capable of safely operating a system and preventing a fire even during driving even though the number of serial unit battery cells is increased and energy capacity is increased, and a secondary battery management system and method for exchanging information in a multi-pack parallel structure using the same.

In addition, an object of the present invention is to provide a secondary battery sub system capable of suppressing an increase in costs without using high-voltage elements used for cell voltage of at least 100 unit battery cells, and a secondary battery management system and method for exchanging information in a multi-pack parallel structure using the same.

Technical Solution

An aspect of this description relates to a secondary battery management system. The secondary battery management system includes a plurality of secondary battery sub systems, a plurality of battery packs, and a sub battery management system (BMS). Each secondary battery sub system includes: a unit battery cell; a battery module in which a plurality of unit battery cells are disposed; and a voltage temperature management system (VTMS) connected to the battery module. The secondary battery sub systems of the plurality of secondary battery sub systems are respectively disposed in the battery packs of the plurality of battery packs. The BMS is connected to the plurality of battery packs to receive diagnosis information from the secondary battery sub system.

The VTMS includes: a cell balancing unit configured to perform a cell balancing for each of the plurality of unit battery cells to generate cell balancing information; a cell temperature sensing unit configured to sense a temperature for each of the plurality of unit battery cells to generate cell temperature sensing information; a cell voltage/current sensing unit configured to sense a voltage for the plurality of unit battery cells to generate cell voltage/current sensing information; a control unit configured to (1) generate state information using the unit battery cell information including the cell balancing information, the cell temperature sensing information, and the cell voltage/current sensing information, and to (2) generate the diagnosis information of the battery by comparing the state information with a set of reference values to determine whether the plurality of unit battery cells or the unit battery cell is abnormal or normal; and a communication unit transmitting the state information or the diagnosis information.

The secondary battery management system may further include: a vehicle controller configured to output the diagnosis information as at least one of a warning sound and a message. The plurality of battery packs may be arranged in parallel and are connected to one sub BMS. The VTMS of each secondary battery sub system of the plurality of secondary battery sub systems may be connected to the sub BMS by a communication signal line and a power line.

The secondary battery management system may further include: a main BMS connected to the sub BMS to receive the diagnosis information, wherein the sub BMS and the main BMS are simultaneously woken-up according to an operation of a start key.

Advantageous Effects

The exemplary embodiments of the present invention can safely operate the system and prevent a fire during driving even though the number of connected battery is increased and the energy capacity is increased, by connecting the voltage temperature management system (VTMS) to each battery module configured of the plurality of serial unit battery cells and grouping the battery pack configured of the battery modules and the VTMS into several and coupling several groups with one sub BMS.

In addition, the exemplary embodiments of the present invention can group the battery pack configured of the battery modules and the VTMS into several and couple several groups with one sub BMS, determine the abnormal state by allowing the VTMS to diagnose the state of each unit battery cell, and inform the sub BMS of the determined results, such that the high-voltage elements for controlling the battery module are not required, thereby saving costs.

BEST MODE

Although the present invention can be modified variously and have several embodiments, the exemplary embodiments are illustrated in the accompanying drawings and will be described in detail in the detailed description. However, the present invention is not limited to the specific embodiments and should be construed as including all the changes, equivalents, and substitutions included in the spirit and scope of the present invention.

In the case it is stated that any components are ₁connected₁ or ₁coupled₁ to other components, it is to be understood that the components may be directly connected or coupled to other components, but there is another component therebetween.

On the other hand, in the case that it is stated that any components are "directly connected₁ or ₁directly coupled₁ to other components, it is to be understood that there is no another component therebetween.

The terms used in the specification are used to describe only specific embodiments and are not intended to limit the present invention. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, a secondary battery sub unit and a secondary battery management system and method for exchanging information in a multi-pack parallel structure using the same according to an exemplary embodiment of the present invention will be described in detail.

Figure 1:
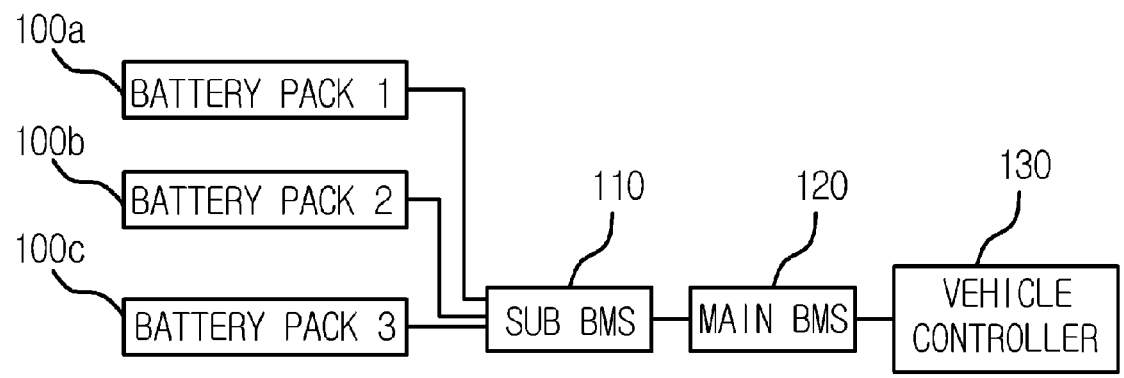
FIG. 1 is a configuration diagram of a secondary battery management system according to an exemplary embodiment of the present invention.

FIG. 1 is a configuration diagram of a secondary battery management system according to an exemplary embodiment of the present invention. Referring to FIG. 1, the secondary battery management system is configured to include a plurality of battery packs 100a to 100c, a sub BMS 110 connected to the plurality of battery packs 100a to 100c, a main BMS 120 connected to the sub BMS 110, a vehicle controller 130 connected to the main BMS 120, and the like.

As shown in FIG. 1, the battery packs 100a to 100c are configured to include three battery packs, that is, a first battery pack 100a, a second battery pack 100b, and a third battery pack 100c. Further, although the three battery packs are shown in FIG. 1, the exemplary embodiment of the present invention is not limited thereto and therefore, at least three battery packs may be used. In addition, in FIG. 1, the battery packs 100a to 100c may be configured in plural and therefore, the sub BMS 110 may be configured in plural. For example, if it is assumed that nine battery packs are configured, one sub BMS per three battery packs is disposed and as a result, three sub BMSs are formed. In addition, as in the cases of the examples, the three sub BMSs are connected to one main BMS.

The vehicle controller 130 serves to control performance of a main system required to drive an electric car in an optimal state. To this end, a controller area network (CAN) communication scheme is used to transmit and receive signals between the vehicle controller 130 and the main BMS 110.

Figure 2:
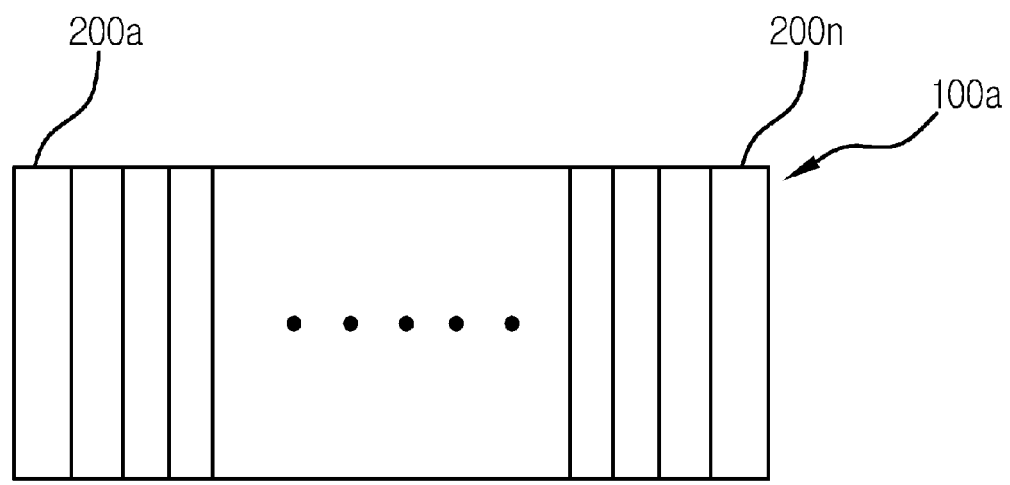
FIG. 2 is a diagram showing a structure of a battery pack 100a shown in FIG. 1.
Figure 3:
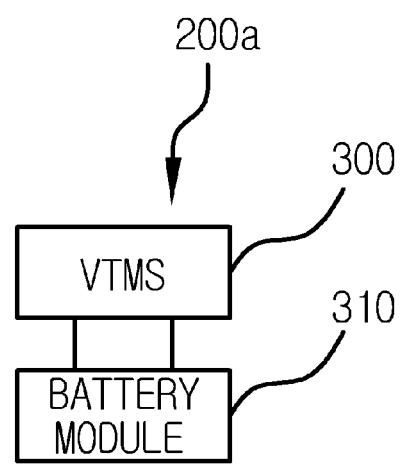
FIG. 3 is a diagram showing a configuration of a secondary battery sub unit 200a shown in FIG. 2.

FIG. 2 is a diagram showing a structure of a battery pack 100a shown in FIG. 1. Referring to FIG. 2, a plurality of secondary battery sub units 200a to 200n are formed in one battery pack 100a. FIG. 3 shows a structure of the secondary battery sub units 200a to 200n. That is, FIG. 3 is a diagram showing a configuration of the secondary battery sub unit 200a shown in FIG. 2.

Referring to FIG. 3, the secondary battery sub unit 200a is configured to include a battery module 310 in which a plurality of unit battery cells (not shown) are disposed and a voltage temperature management system (VTMS) 300 that calculates a battery state using voltage, temperature, and current of the plurality of unit battery cells, generates diagnosis information by diagnosing the plurality of unit battery cells, and generates and transmits abnormal or normal information by using the diagnosis information.

The battery module 310 has a form in which the plurality of unit battery cells are formed in series so as to be formed like one package. For example, the battery module 310 may be configured of 20 unit battery cells. Further, the exemplary embodiment of the present invention describes the plurality of unit battery cells that are connected to each other in series but is not limited thereto. Therefore, the plurality of unit battery cells can be connected with each other in series and/or in parallel.

Figure 4:
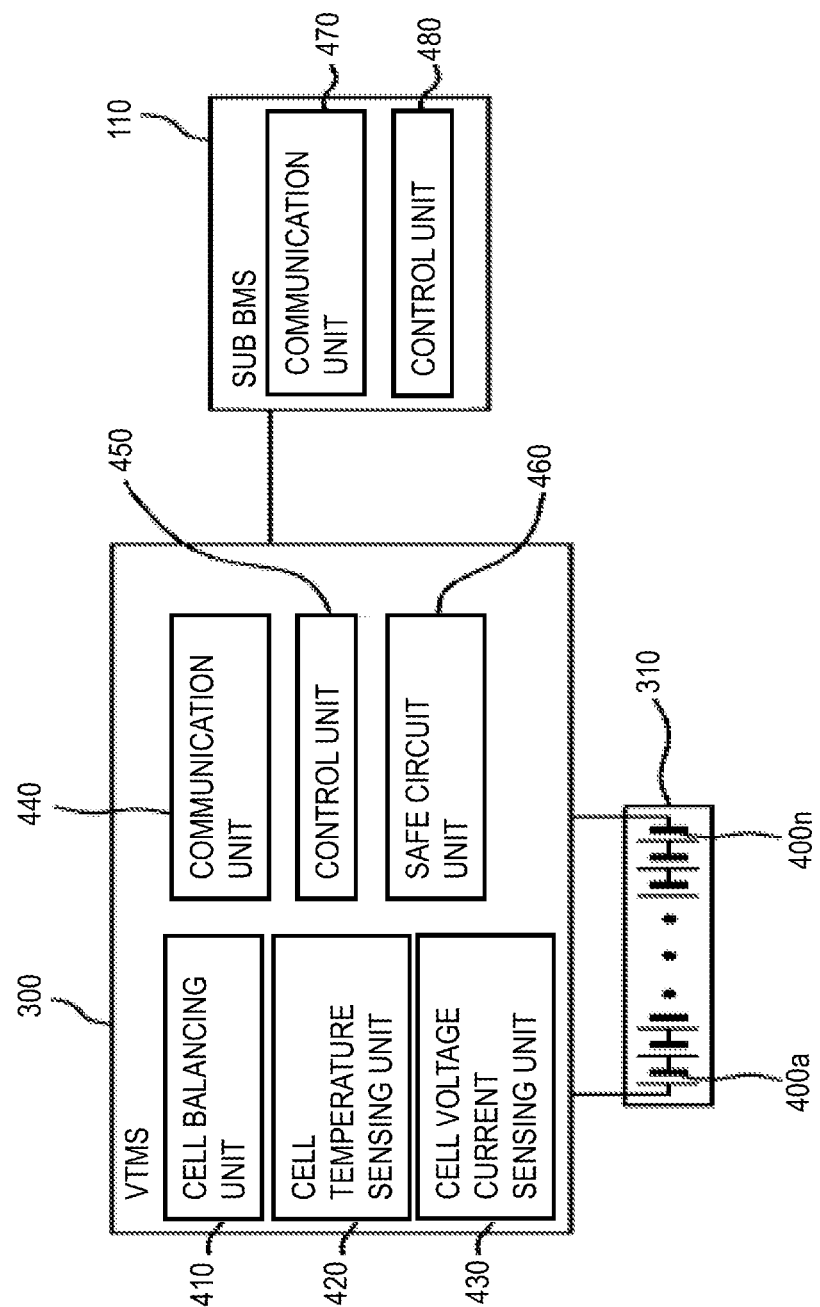
FIG. 4 is a configuration diagram of a VTMS 300 according to an exemplary embodiment of the present invention.

The VTMS 300 uses the voltage, temperature, and current of the plurality of unit battery cells to calculate the state information of the battery module 310 and diagnoses the unit battery cells to generate the diagnosis information. In addition, the VTMS serves to generate and transmit the abnormal or normal information by using the diagnosis information. FIG. 4 shows a configuration of the VTMS. That is, FIG. 4 is a configuration diagram of the VTMS 300 according to the exemplary embodiment of the present invention.

Referring to FIG. 4, the VTMS 300 may include: a cell balancing unit 410 that performs the cell balancing on a plurality of unit battery cells 400a to 400n to generate the cell balancing information; a cell temperature sensing unit 420 that senses temperature for the plurality of unit battery cells 400a to 400n to generate the cell temperature sensing information; a cell voltage/current sensing unit 430 that senses voltage/current for the plurality of unit battery cells 400a to 400n to generate the cell voltage/current sensing information; a control unit 450 that uses the unit battery cell information to generate the state information and the diagnosis information of the battery module by comparing the state information with a set of reference values to determine whether the plurality of unit battery cells 400a to 400n are in an abnormal or normal state and generate the abnormal or normal information; and a communication unit 450 that transmits the battery state information and the diagnosis information that includes the abnormal or normal information of the unit battery cells, and the like.

The cell balancing unit 410 senses the charge state of each unit battery cells 400a to 400n to generate the cell balancing information and balance each of the unit battery cells 400a to 400n. That is, the cell balancing unit 410 serves to discharge the cell having a relatively high charge state and charge the cell having a relatively low charge state.

In this case, the unit battery cells 400a to 400n may be a nickel metal battery, a lithium ion battery, and the like.

The cell temperature sensing unit 420 senses temperature T of each unit battery cell 400a to 400n to generate the cell temperature information.

The cell voltage/current sensing unit 430 senses the voltage V and/or current I of each unit battery cell 400a to 400n to generate the cell voltage/current information.

Further, the cell balancing information, the cell temperature information, the cell voltage information, the cell current information, and the like, may be measured as an analog value and converted into a digital value by the control unit 450 or may be previously converted into a digital value and may be transferred to the control unit 450.

The control unit 450 receives the unit battery cell information including the cell balancing information, the cell temperature information, the cell voltage information, and/or the cell current information, and the like, from the cell balancing unit 410, the cell temperature sensing unit 420, and the cell voltage/current sensing unit 430. Thereafter, the control unit 450 estimates the state of charge (SOC) and a state of health (SOH) of the battery module 310 configured of each unit battery cells 400a to 400n and generates the battery state information, the battery state information including the charge and discharge maximum current information of the battery module 310.

The control unit 450 also generates the cell diagnosis information for the voltage, current, and temperature of each unit battery cell 400a to 400n, and the like, including a the abnormal or normal information from the corresponding unit battery cells 400a to 400n or the battery module 310. For the calculation, the control unit 450 is configured of a microprocessor, a memory, and the like. Herein, the memory stores data, algorithms using the diagnosis information to determine the abnormal state of the corresponding unit battery cells 400a to 400n and generate the abnormal or normal information, and the like.

Therefore, the memory may be a memory that is included in the microprocessor and may be a separate memory. Therefore, the memory may be a nonvolatile memory, such as a hard disk drive, a flash memory, an electrically erasable programmable read-only memory (EEPROM), a static RAM (SRAM), a ferro-electric RAM (FRAM), a phase-change RAM (PRAM), a magnetic RAM (MRAM), and the like, and/or a volatile memory such as a random access memory (RAM), a dynamic random access memory (DRAM), and the like.

The communication unit 440 communicates with the sub BMS 110. That is, the communication unit 440 receives a wake-up signal from the sub BMS 110 or transmits the diagnosis information and/or the abnormal or normal information to the sub BMS 110.

Here, the wake-up signal means a signal informing an operation start when a driver starts a vehicle. Therefore, the VTMS 300 starts an operation when receiving the wake-up signal from the sub BMS 110.

A safe circuit unit 460 is a secondarily added circuit that uses the hardware elements to protect the unit battery cells 400a to 400n from overcurrent, overvoltage, and the like.

Further, the sub BMS 100 includes the control unit 480, the communication unit 470, a memory (not shown), and the like. Similarly, the main BMS (120 of FIG. 1) also includes the control unit, the communication unit, the memory, and the like.

Here, only a communication signal line and a power line connect between the VTMS 300 and the sub BMS 110 and other wiring harnesses are not used. Therefore, other wiring harnesses are not used and therefore, the problems such as the increase in weight and volume of the wiring harness that is caused due to the increase of the unit battery cells, the reinforce of the BMS interval pressure due to the formation of the high voltage end, and the like, are reduced.

Figure 5:
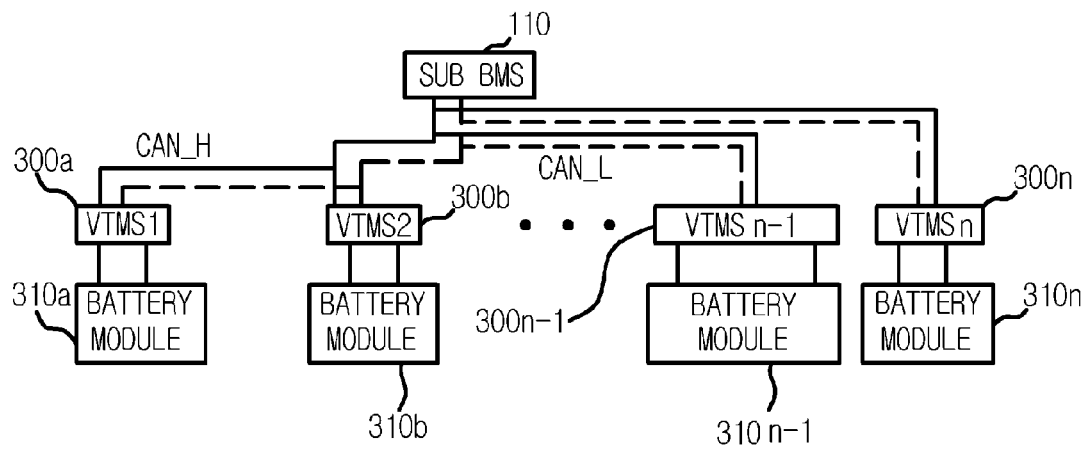
FIG. 5 is a configuration diagram schematically showing a secondary battery management system according to the exemplary embodiment of the present invention.

FIG. 5 is a configuration diagram schematically showing a secondary battery management system according to the exemplary embodiment of the present invention. FIG. 5 shows a state in which the plurality of VTMSs 300a to 300n are connected to the sub BMS 110. Further, a wiring harness CAN_H and CAN_L for controller area network (CAN) communication between the sub BMS 110 and the plurality of VTMSs 300a to 300n is configured.

The communication information between the sub BMS 110 and the plurality of VTMSs 300a to 300n is listed in Table 1. Further, Table 1 shows the communication information from the VTMSs 300a to 300n to the sub BMS 110.

TABLE 1

| Information | Contents |
|---|---|
| VM_max | Maximum voltage within module |
| VM_min | Minimum voltage within module |
| No_VM_max | Maximum voltage cell number within module |
| No_VM_min | Minimum voltage cell number within module |
| V_module | Module voltage |
| Tbmax | Battery maximum temperature within module |
| Tbmin | Battery minimum temperature within module |
| Tb_avg | Battery average temperature within module |
| SOC | Charge state within module |
| Available Charge Power | Available charge power |
| Available discharge Power | Available discharge power |
| VTMS_Rdy | VTMS ready state |
| Cell Balancing On/Off | Whether cell balancing is operated within module |
| Normal/Warning/Fault | Module battery and sensor operation state |

The communication information from the sub BMS 110 to the VTMSs 300a to 300n is listed in Table 2.

TABLE 2

| Information | Contents |
|---|---|
| Sub BMS_Rdy | Sub BMS ready state |
| Normal/Warning/Fault | Battery and system operation system within all the Sub Packs |
| Balancing On/Off | Whether balancing operation is performed |
| No_Balancing ON | Balancing operation module number |

Figure 6:
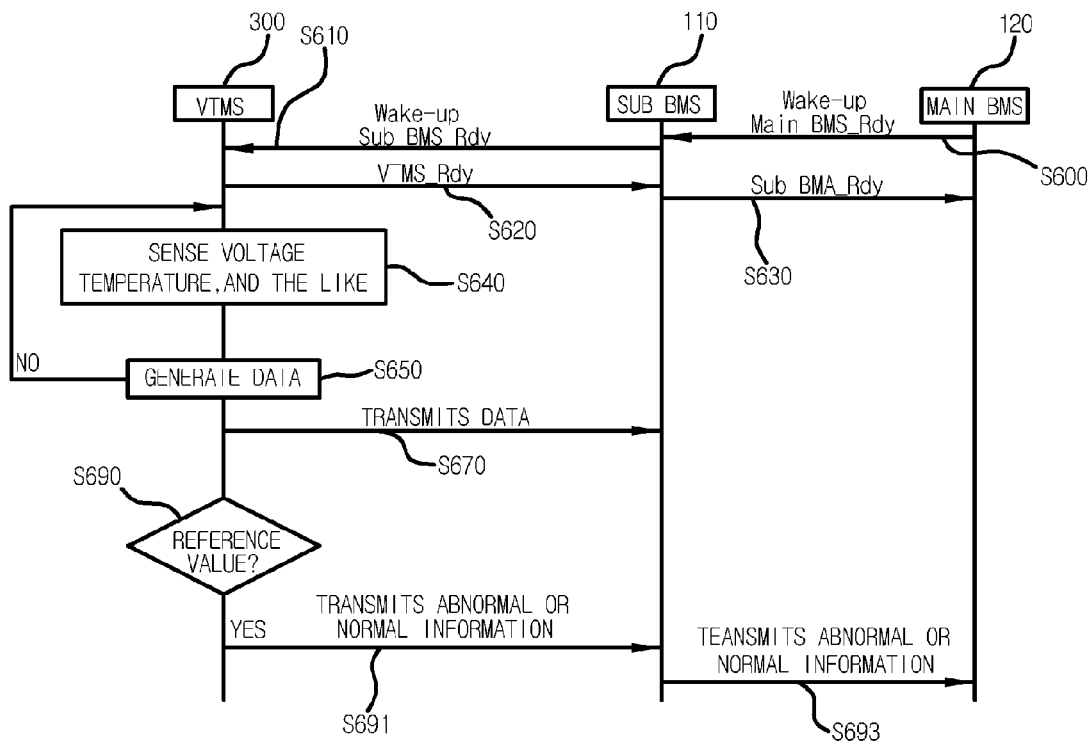
FIG. 6 is a flow chart showing a flow of data according to the secondary battery management system according to the exemplary embodiment of the present invention.

FIG. 6 is a flow chart showing a flow of data according to the secondary battery management system according to the exemplary embodiment of the present invention. Referring to FIG. 6, when a vehicle starts, a main BMS_Rdy signal that is a wake-up signal informing the wake-up of the main BMS 120 is transmitted from the main BMS 120 to the sub BMS 110 (S600).

Therefore, the sub BMS_Rdy signal that is the wake-up signal informing that the sub BMS 110 is ready is transmitted to the VTMS 300 (S610).

The VTMS 300 receiving the wake-up signal transmits the VTMS_Rdy signal informing that the operation of the VTMS 300 is ready to the sub BMS 110 (S620).

As a result, a sub BMS_Rdy signal informing that the operation of the sub BMS 110 is ready is transmitted to the main BMS 120 (S630).

Further, FIG. 6 sequentially shows convenience of understanding, but the exemplary embodiment of the present invention is not limited thereto. The sub BMS 110 and the main BMS 120 may also be waken-up simultaneously according to the operation of a start key.

Thereafter, the VTMS 300 senses the voltage, temperature, current, and the like, of the unit battery cells 400a to 400n included in the battery module 310 (FIG. 4) to generate the diagnosis information (S640 and S650).

When the diagnosis information is generated, the diagnosis information is transmitted to the sub BMS 110 (S670).

In addition, the VTMS 300 uses the diagnosis information to compare with the preset reference value and if it is determined that the diagnosis information is higher than the reference value, generates the abnormal or normal information and transmits the generated abnormal or normal information to the sub BMS 110 and the main BMS 120 (S691 and S693).

Unlike this, the VTMS compares the diagnosis information with the reference value and if it is determined that the diagnosis information is lower than the reference value, S640 to S690 are repeatedly performed.

DETAILED DESCRIPTION OF MAIN ELEMENTS

100a to 100n: BatteryPack
110: Sub BMS (BatteryManagementSystem)
120: Main BMS
130: Vehicle controller
200a to 200n: Secondary battery sub unit
300: VTMS (Voltage Temperature Management System)
310: Batterymodule
400a to 400n: Unit battery cell
410: Cell balancing unit
420: Cell temperature sensing unit
430: Cell voltage/current sensing unit
440: Communication unit
450: Control unit
460: Safe circuit unit
470: Communication unit
480: Control unit

The invention claimed is:

1. A secondary battery management system, comprising:
a plurality of secondary battery sub systems, each secondary battery sub system of the plurality of secondary battery sub systems comprising:
  a unit battery cell;
  a battery module in which a plurality of unit battery cells are disposed; and
  a voltage temperature management system (VTMS) connected to the battery module;
a plurality of battery packs in which the plurality of secondary battery sub systems are respectively disposed; and
a sub battery management system (BMS) connected to the plurality of battery packs to receive diagnosis information from the secondary battery sub system,
wherein the VTMS comprises:
  a cell balancing unit configured to perform a cell balancing for each of the plurality of unit battery cells to generate cell balancing information;
  a cell temperature sensing unit configured to sense a temperature for each of the plurality of unit battery cells to generate cell temperature sensing information;
  a cell voltage/current sensing unit configured to sense a voltage for each of the plurality of unit battery cells to generate cell voltage/current sensing information;
  a control unit configured to (1) generate state information using unit battery cell information including the cell balancing information, the cell temperature sensing information, and the cell voltage/current sensing information, and to (2) generate the diagnosis information of a battery module or the unit battery cells by comparing the state information with a set of reference values to determine whether the plurality of unit battery cells or the unit battery cell is abnormal or normal; and
  a communication unit configured to transmit the diagnosis information to the sub BMS.

2. The secondary battery management system of claim 1, further comprising:

a vehicle controller configured to output the diagnosis information as at least one of a warning sound and a message.

3. The secondary battery management system of claim 1, wherein the plurality of battery packs are arranged in parallel and are connected to one sub BMS.

4. The secondary battery management system of claim 1, wherein the VTMS of each secondary battery sub system of the plurality of secondary battery sub systems is connected to the sub BMS by a communication signal line and a power line.

5. The secondary battery management system of claim 1, further comprising:
   a main BMS connected to the sub BMS to receive the diagnosis information,
   wherein the sub BMS and the main BMS are simultaneously woken-up according to an operation of a start key.

* * * * *